(12) United States Patent
Sato

(10) Patent No.: US 10,288,673 B2
(45) Date of Patent: May 14, 2019

(54) SEMICONDUCTOR DEVICE AND METHOD OF MEASURING THE SAME

(71) Applicant: FUJI ELECTRIC CO., LTD., Kawasaki-shi, Kanagawa (JP)

(72) Inventor: Tadahiko Sato, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 36 days.

(21) Appl. No.: 15/225,789

(22) Filed: Aug. 1, 2016

(65) Prior Publication Data

US 2017/0082679 A1 Mar. 23, 2017

(30) Foreign Application Priority Data

Sep. 17, 2015 (JP) ................. 2015-183809

(51) Int. Cl.
*G01R 31/26* (2014.01)
*H01L 23/492* (2006.01)
*H01L 23/498* (2006.01)

(52) U.S. Cl.
CPC ........ *G01R 31/2644* (2013.01); *H01L 23/492* (2013.01); *H01L 23/49805* (2013.01); *H01L 23/49838* (2013.01); *H01L 2224/48091* (2013.01); *H01L 2224/48137* (2013.01); *H01L 2224/48247* (2013.01); *H01L 2224/48472* (2013.01); *H01L 2224/4903* (2013.01); *H01L 2224/73265* (2013.01); *H01L 2924/19107* (2013.01)

(58) Field of Classification Search
CPC ... G01R 31/26; G01R 31/2644; H01L 23/492; H01L 23/49805; H01L 23/49838
See application file for complete search history.

(56) References Cited

U.S. PATENT DOCUMENTS 5,865,637 A * 2/1999 Shinozaki .............. H01R 11/12
439/287
6,046,501 A * 4/2000 Ishikawa ............. H01L 23/3107
257/728
6,046,526 A * 4/2000 Maruyama .......... H01L 41/0474
310/323.01

(Continued)

FOREIGN PATENT DOCUMENTS

JP H04-354156 A 12/1992
JP H06-350024 A 12/1994

(Continued)

*Primary Examiner* — Huy Q Phan
*Assistant Examiner* — David B Frederiksen
(74) *Attorney, Agent, or Firm* — Rabin & Berdo, P.C.

(57) ABSTRACT

A semiconductor device includes first and second contact parts that are disposed close to each other with an interval therebetween and form a screw hole (connection area) to which an external connection terminal is connected. The first contact part extends from a side of a case via a first linkage part that extends from the side, and the second contact part extends from the side via a second linkage part that extends from the side. The first and second linkage parts are disposed away from each other by at least a certain interval. In this way, the semiconductor device is allowed to have first and second semiconductor chips connected in parallel with each other and function as a semiconductor device. In addition, electrical characteristics of the first and second semiconductor chips of the semiconductor device are individually measured.

17 Claims, 13 Drawing Sheets

(56) References Cited

U.S. PATENT DOCUMENTS

| | | | |
|---|---|---|---|
| 6,340,840 B1 * | 1/2002 | Ohsawa | H01L 23/49861 257/668 |
| 6,803,659 B2 * | 10/2004 | Suwa | H01L 23/49822 257/691 |
| 8,115,290 B2 * | 2/2012 | Yamamoto | H01L 23/49838 257/678 |
| 8,366,499 B2 * | 2/2013 | Shuey | H01R 11/09 439/883 |
| 2004/0212016 A1 * | 10/2004 | Yasui | H01L 22/34 257/365 |
| 2004/0251528 A1 | 12/2004 | Kikuchi et al. | |
| 2010/0059875 A1 * | 3/2010 | Sato | H01L 23/4952 257/690 |
| 2011/0312134 A1 * | 12/2011 | Machida | H01L 21/4842 438/123 |
| 2013/0049132 A1 * | 2/2013 | Doris | H01L 21/7682 257/383 |
| 2013/0206460 A1 * | 8/2013 | Mochizuki | H05K 3/4608 174/255 |
| 2014/0374889 A1 | 12/2014 | Denta et al. | |
| 2015/0138733 A1 * | 5/2015 | Tsuda | H01L 23/49811 361/733 |
| 2015/0200147 A1 * | 7/2015 | Lien | H01L 21/56 257/678 |
| 2015/0357374 A1 * | 12/2015 | Wang | H01L 27/20 257/417 |
| 2016/0056138 A1 * | 2/2016 | Shibib | H01L 29/7815 257/48 |
| 2016/0155726 A1 * | 6/2016 | Kanazawa | H01L 29/78 257/77 |
| 2016/0322726 A1 * | 11/2016 | Kadoguchi | H01R 12/716 |

FOREIGN PATENT DOCUMENTS

| | | |
|---|---|---|
| JP | 2000-307068 A | 11/2000 |
| JP | 2002-017080 A | 1/2002 |
| JP | 2005-005416 A | 1/2005 |
| JP | 2005-183463 A | 7/2005 |
| JP | 2005-244144 A | 9/2005 |
| JP | 2013-258321 A | 12/2013 |

* cited by examiner

SEMICONDUCTOR DEVICE AND METHOD OF MEASURING THE SAME

CROSS-REFERENCE TO RELATED APPLICATION

This application is based upon and claims the benefit of priority of the prior Japanese Patent Application No. 2015-183809, filed on Sep. 17, 2015, the entire contents of which are incorporated herein by reference.

BACKGROUND OF THE INVENTION

1. Field of the Invention

The embodiments discussed herein relate to a semiconductor device and a method of measuring the same.

2. Background of the Related Art

There are semiconductor devices that include power semiconductor chips and that are used as power conversion devices or switching devices. For example, there is a semiconductor device in which a semiconductor chip including an insulated gate bipolar transistor (IGBT) and a semiconductor chip including a metal-oxide-semiconductor field-effect transistor (MOSFET) are connected in parallel with each other, and this semiconductor device is able to function as a switching device (for example, see Japanese Laid-open Patent Publication No. 04-354156).

Japanese Laid-open Patent Publication No. 04-354156 discusses a semiconductor device in which the emitter terminal of an IGBT and the source terminal of a MOSFET are connected to the emitter terminal of the semiconductor device at the same potential. In addition, the collector terminal of the IGBT and the drain terminal of the MOSFET are connected to an external collector terminal of the semiconductor device at the same potential. With this configuration, when an input signal is inputted to the external collector terminal of the semiconductor device, the gate of the IGBT or the MOSFET is brought in an on- or off-state, and as a result, an output signal is obtained from the emitter terminal of the semiconductor device. Consequently, a low-loss switching function is obtained.

In the semiconductor device discussed in Japanese Laid-open Patent Publication No. 04-354156, the semiconductor chips (IGBT, MOSFET) are connected in parallel with each other with respect to the emitter terminal and the external collector terminal of the semiconductor device. Thus, when characteristics such as a factory-default withstand voltage and a leakage current are measured, a semiconductor chip having the lower characteristics (having the lower withstand voltage or the larger leakage current) is measured. Namely, it is difficult to measure characteristics of the other semiconductor chip. In addition, when a forward voltage drop or the like is measured, since synthesized characteristics of a plurality of semiconductor chips appear, it is difficult to measure characteristics of an individual semiconductor chip. Thus, it is difficult to appropriately measure characteristics of the semiconductor device according to Japanese Laid-open Patent Publication No. 04-354156 after the semiconductor device is assembled.

To address this problem, external connection terminals that are electrically connected to the collector terminal and the drain terminal of the respective semiconductor chips (IGBT and MOSFET) may be used, in place of the external collector terminal of the semiconductor device. In this case, on the basis of an output signal obtained from the external emitter terminal of the semiconductor device when an input signal is inputted to one of the external connection terminals, electrical characteristics of a corresponding semiconductor chip can be measured.

To assemble a semiconductor device as described above, the individual external connection terminals need to be connected electrically to the collector terminal and the drain terminal of the respective semiconductor chips (IGBT, MOSFET). However, the connection of these external connection terminals may complicate the connection around the semiconductor device, which makes it difficult to achieve downsizing of the connection around the semiconductor device.

SUMMARY OF THE INVENTION

According to one aspect, there is provided a semiconductor device including: a first semiconductor chip and a second semiconductor chip that are disposed on a metal plate; a first electrode terminal that is electrically connected to a main electrode of the first semiconductor chip; and a second electrode terminal that is electrically connected to a main electrode of the second semiconductor chip, wherein the first electrode terminal includes a first contact part, and the second electrode terminal includes a second contact part, and wherein the first contact part and the second contact part are disposed close to each other with an interval therebetween and form a connection area to which an external connection terminal is connected.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1A:
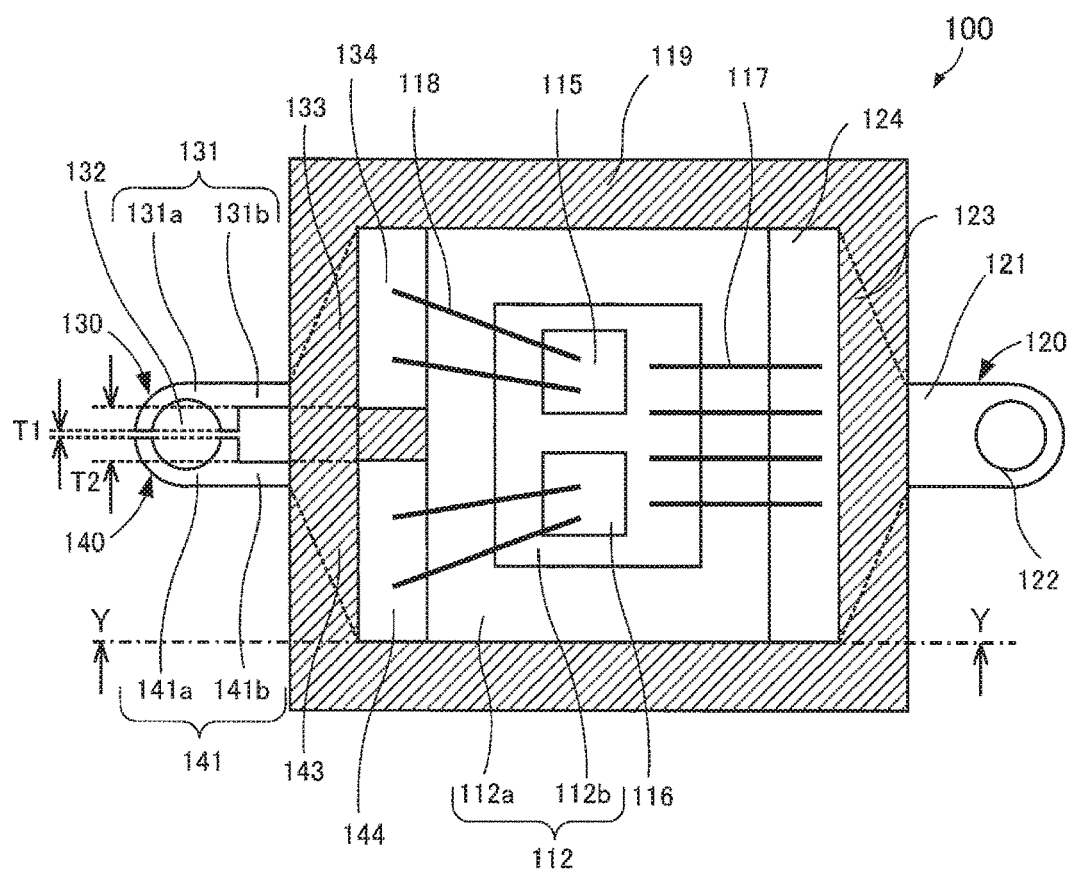
FIGS. 1A and 1B illustrate a semiconductor device according to a first embodiment.

Hereinafter, embodiments will be described below with reference to the accompanying drawings, wherein like reference characters refer to like elements throughout.

First Embodiment

First, a semiconductor device will be described with reference to FIGS. 1A and 1B.

Figure 1B:
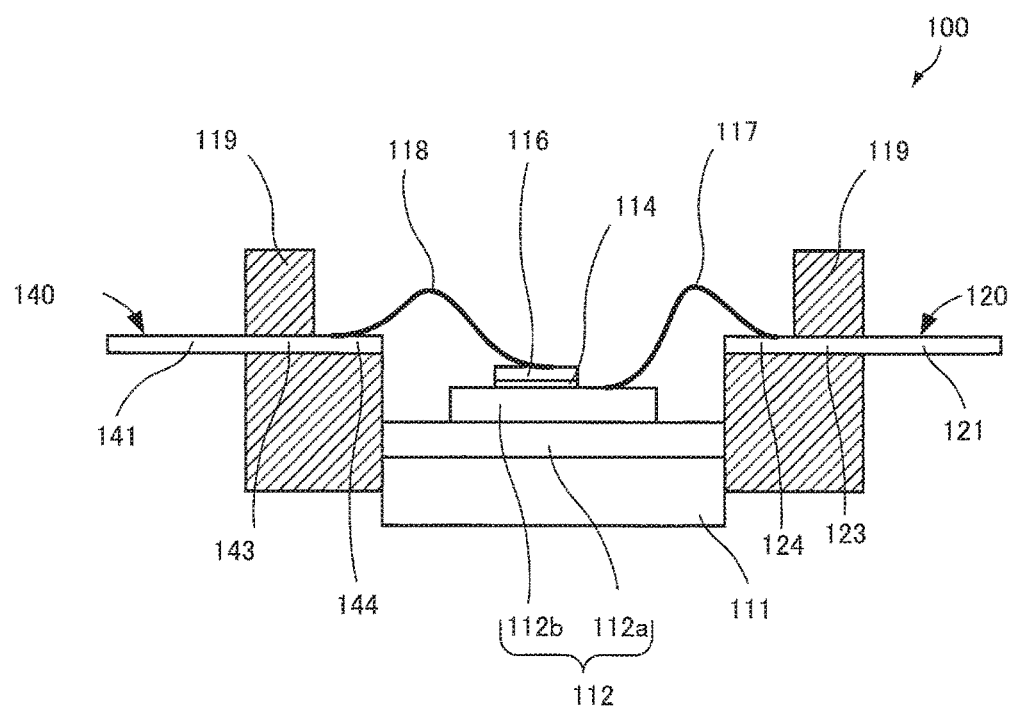

FIGS. 1A and 1B illustrate a semiconductor device 100 according to the first embodiment.

FIG. 1A is a top view of the semiconductor device 100, and FIG. 1B is a sectional view taken along dashed line Y-Y in FIG. 1A.

In the semiconductor device 100, an aluminum insulating substrate 111, a multi-layer substrate 112 that is disposed on the aluminum insulating substrate 111 and that includes an insulating plate 112a and a metal plate 112b, and semiconductor chips 115 and 116 that are disposed on the metal plate 112b via solder 114 are stacked. These elements are held and sealed with sealing resin (not illustrated) in a case 119.

For example, each of the semiconductor chips 115 and 116 includes a diode, the back and front sides of each of the semiconductor chips 115 and 116 are provided with cathode and anode electrodes, respectively. The metal plate 112b is electrically connected to the cathode electrodes on the back sides of the semiconductor chips 115 and 116.

In addition, the case 119 is provided with an electrode terminal 120 (on the right side in FIGS. 1A and 1B) and a first electrode terminal 130 and a second electrode terminal 140 (on the left side in FIGS. 1A and 1B). Each of the electrode terminal 120, the first electrode terminal 130, and the second electrode terminal 140 is formed by a conductive member.

The electrode terminal 120 includes an external connection part 121, a conduction part 123, and a wiring connection part 124.

The external connection part 121 extends from a side of the case 119 and has a screw hole 122 to which an external connection terminal is connected via a screw.

The conduction part 123 is electrically connected to the external connection part 121 and is incorporated in the case 119.

The wiring connection part 124 is electrically connected to the conduction part 123 and is disposed inside the case 119. In addition, the wiring connection part 124 is electrically connected to the metal plate 112b of the multi-layer substrate 112 via bonding wires 117.

The first electrode terminal 130 includes a first external connection part 131, a first conduction part 133, and a first wiring connection part 134.

The first external connection part 131 extends from a side of the case 119 and includes a first contact part 131a and a first linkage part 131b.

For example, the first contact part 131a is formed in the shape of an arc and is connected to the first linkage part 131b.

The first linkage part 131b is connected to the first contact part 131a and the first conduction part 133.

The first conduction part 133 is electrically connected to the first external connection part 131 and is incorporated in the case 119.

The first wiring connection part 134 is electrically connected to the first conduction part 133 and is disposed inside the case 119. In addition, the first wiring connection part 134 is electrically connected to the anode electrode of the first semiconductor chip 115 on the metal plate 112b of the multi-layer substrate 112 via bonding wires 118.

In addition, the second electrode terminal 140 includes a second external connection part 141, a second conduction part 143, and a second wiring connection part 144.

The second external connection part 141 extends from the side of the case 119 and includes a second contact part 141a and a second linkage part 141b. The second external connection part 141 is disposed in parallel with the first external connection part 131.

For example, the second contact part 141a is formed in the shape of an arc and is connected to the second linkage part 141b.

The second linkage part 141b is connected to the second contact part 141a and the second conduction part 143.

The second conduction part 143 is electrically connected to the second external connection part 141 and is incorporated in the case 119.

The second wiring connection part 144 is electrically connected to the second conduction part 143 and is disposed inside the case 119. In addition, the second wiring connection part 144 is electrically connected to the anode electrode of the second semiconductor chip 116 on the metal plate 112b of the multi-layer substrate 112 via bonding wires 118.

The first contact part 131a of the first electrode terminal 130 and the second contact part 141a of the second electrode terminal 140 are disposed close to each other with an interval T1 therebetween and form a screw hole 132 (connection area) to which an external connection terminal is connected via a screw.

In addition, the first linkage part 131b and the second linkage part 141b are disposed away from each other by at least a certain interval T2. As will be described below, this is to prevent the first linkage part 131b and the second linkage part 141b from electrically affecting each other when measuring electrical characteristics of the first semiconductor chip 115 and the second semiconductor chip 116 by bringing a test electrode into contact with an individual one of the first linkage part 131b and the second linkage part 141b.

Next, measurement of electrical characteristics of the first semiconductor chip 115 and the second semiconductor chip 116 of the semiconductor device 100 having the first electrode terminal 130 and the second electrode terminal 140 will be described with reference to FIGS. 2A and 2B.

Figure 2A:
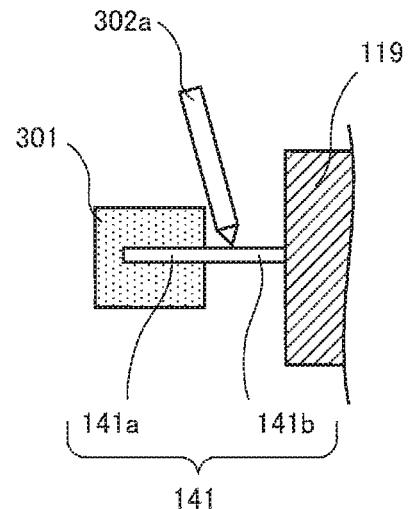
FIGS. 2A and 2B illustrate measurement of electrical characteristics of semiconductor chips of the semiconductor device according to the first embodiment.
Figure 2B:
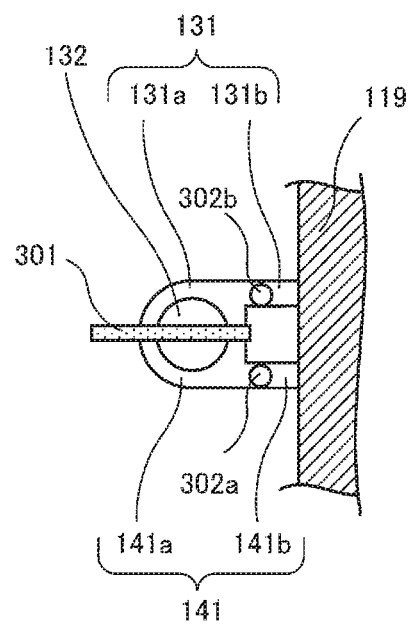

FIGS. 2A and 2B illustrate measurement of electrical characteristics of the semiconductor chips of the semiconductor device according to the first embodiment.

FIGS. 2A and 2B illustrate only some elements around the first electrode terminal 130 and the second electrode terminal 140 of the semiconductor device 100. The other elements are the same as those illustrated in FIGS. 1A and 1B. FIG. 2A is a side view of the external connection part 141 of the semiconductor device 100 whose electrical characteristics are measured, and FIG. 2B is a top view of the external connection parts 131 and 141 of the semiconductor device 100 whose electrical characteristics are measured.

To measure electrical characteristics of the first semiconductor chip 115 and the second semiconductor chip 116 of the semiconductor device 100, first, an insulating separator 301 is inserted into the interval between the first contact part 131a of the first electrode terminal 130 (the first external connection part 131) and the second contact part 141a of the second electrode terminal 140 (the second external connection part 141). In this way, the first electrode terminal 130 and the second electrode terminal 140 are electrically insulated from each other.

In addition, test electrodes 302a and 302b connected to an input device (not illustrated) that inputs an input signal are brought into contact with the first linkage part 131b of the first electrode terminal 130 (the first external connection part 131) and the second linkage part 141b of the second electrode terminal 140 (the second external connection part 141), respectively. The input device is able to input an input signal to one or each of the test electrodes 302a and 302b.

In addition, a detection device (not illustrated) is connected to the external connection part 121 of the electrode terminal 120 of the semiconductor device 100. This detection device acquires output signals outputted from the first semiconductor chip 115 and the second semiconductor chip 116 via the electrode terminal 120 (the external connection part 121) and detects electrical characteristics.

When electrical characteristics of the first semiconductor chip 115 and the second semiconductor chip 116 are measured in this way, since the first linkage part 131b and the second linkage part 141b are disposed away from each other by at least the certain interval, the first linkage part 131b and the second linkage part 141b, with which the test electrodes 302a and 302b are brought into contact, do not electrically affect each other.

Next, a circuit configuration when the semiconductor device 100 is caused to function will be described with reference to FIG. 3A. In addition, a circuit configuration when electrical characteristics of the first semiconductor chip 115 and the second semiconductor chip 116 of the semiconductor device 100 are measured will be described with reference to FIG. 3B.

Figure 3A:
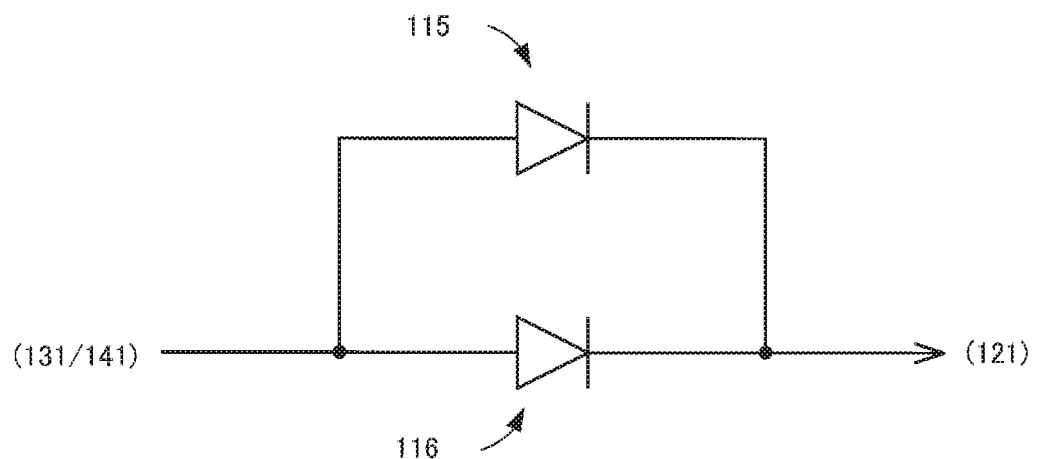
FIGS. 3A and 3B illustrate circuit configurations of the semiconductor device according to the first embodiment.
Figure 3B:
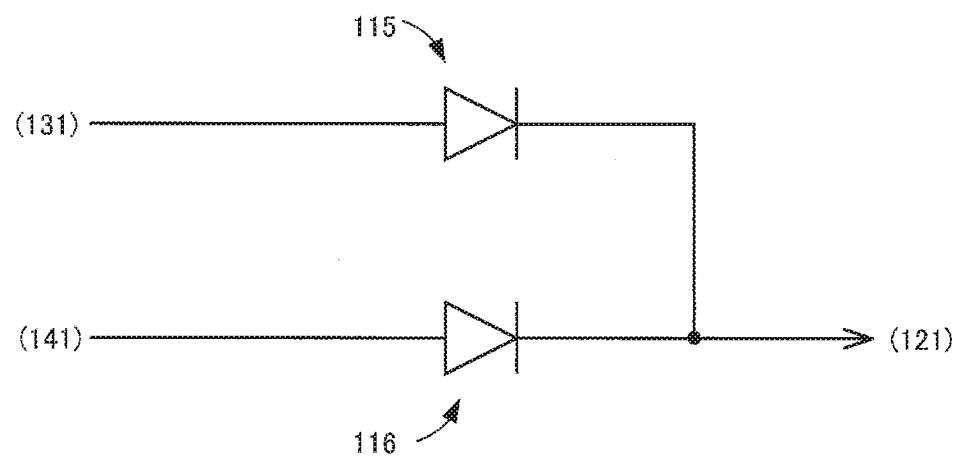

FIGS. 3A and 3B illustrate circuit configurations of the semiconductor device according to the first embodiment.

More specifically, FIG. 3A illustrates a circuit configuration when the semiconductor device 100 is caused to function, and FIG. 3B illustrates a circuit configuration when electrical characteristics of the first semiconductor chip 115 and the second semiconductor chip 116 of the semiconductor device 100 are measured.

By connecting the first semiconductor chip 115 and the second semiconductor chip 116 in parallel with each other, the semiconductor device 100 is caused to function as a single device. In this case, an external connection terminal (input) is fixed in the screw hole 132 formed by the first contact part 131a of the first electrode terminal 130 (the first external connection part 131) and the second contact part 141a of the second electrode terminal 140 (the second external connection part 141) with a screw, and the first contact part 131a and the second contact part 141a are maintained at the same potential. In addition, similarly, an external connection terminal (output) is fixed in the screw hole 122 formed in the electrode terminal 120 (the external connection part 121) with a screw.

Next, an input signal is inputted from the external connection terminal to the first contact part 131a of the first electrode terminal 130 (the first external connection part 131) and the second contact part 141a of the second electrode terminal 140 (the second external connection part 141). The inputted input signal is inputted to the anode electrodes of the first semiconductor chip 115 and the second semiconductor chip 116 via the first conduction part 133 and the second conduction part 143, the first wiring connection part 134 and the second wiring connection part 144, and the bonding wires 118. Next, output signals from the cathode electrodes of the first semiconductor chip 115 and the second semiconductor chip 116 are outputted from the electrode terminal 120 (the external connection part 121) to the outside via the metal plate 112b and the bonding wires 117 (see FIG. 3A).

When electrical characteristics of the first semiconductor chip 115 and the second semiconductor chip 116 of the semiconductor device 100 are measured, as described above, the separator 301 is inserted into the interval between the first contact part 131a of the first electrode terminal 130 (the first external connection part 131) and the second contact part 141a of the second electrode terminal 140 (the second external connection part 141). Next, the test electrodes 302a and 302b connected to the input device (not illustrated) that inputs an input signal are brought into contact with the first linkage part 131b of the first electrode terminal 130 (the first external connection part 131) and the second linkage part 141b of the second electrode terminal 140 (the second external connection part 141), respectively.

In this state, for example, when the input device inputs an input signal to the first external connection part 131 (the first linkage part 131b) via the test electrode 302b, the input signal is inputted to the anode electrode of the first semiconductor chip 115 via the first conduction part 133 and the first wiring connection part 134 of the first electrode terminal 130 and a corresponding bonding wire 118. Next, an output signal outputted from the cathode electrode of the first semiconductor chip 115 is outputted to the detection device via the metal plate 112b, a corresponding bonding wire 117, and the electrode terminal 120 (the external connection part 121). In this way, electrical characteristics of the first semiconductor chip 115 are measured (see FIG. 3B).

In contrast, when the input device inputs an input signal to the second external connection part 141 (the second linkage part 141b) via the test electrode 302a, the input signal is inputted to the anode electrode of the second semiconductor chip 116 via the second conduction part 143 and the second wiring connection part 144 of the second electrode terminal 140 and a corresponding bonding wire 118. Next, an output signal outputted from the cathode electrode of the second semiconductor chip 116 is outputted to the detection device via the metal plate 112b, a corresponding bonding wire 117, and the electrode terminal 120 (the external connection part 121). In this way, electrical characteristics of the second semiconductor chip 116 are measured (see FIG. 3B).

Next, semiconductor devices as reference examples that are compared with the semiconductor device 100 will be described with reference to FIGS. 4A and 4B.

Figure 4A:
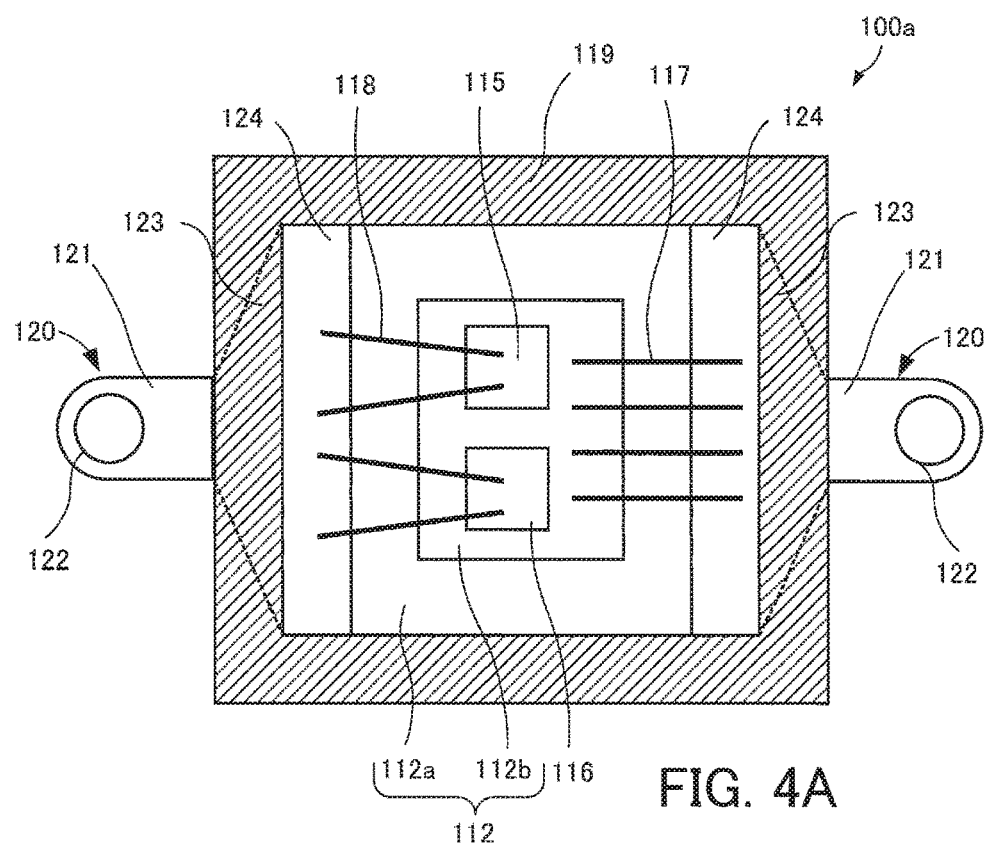
FIGS. 4A and 4B illustrate semiconductor devices as reference examples.
Figure 4B:
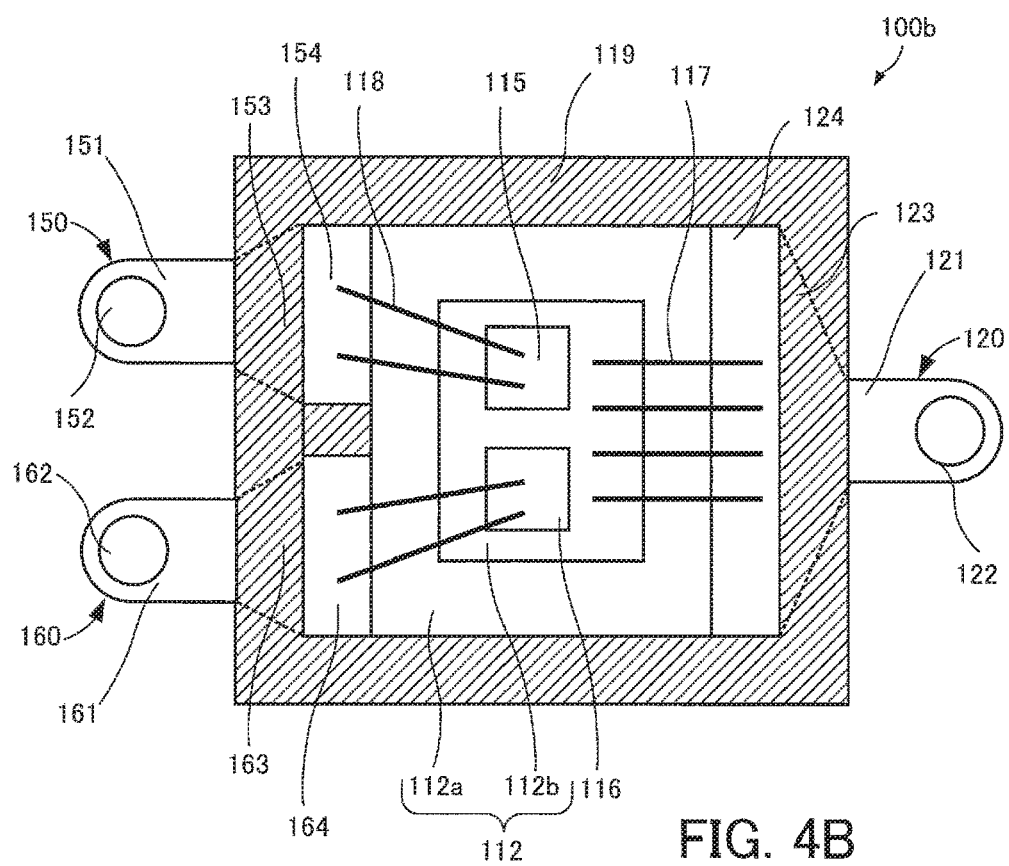

FIGS. 4A and 4B illustrate semiconductor devices as reference examples.

In FIG. 4A, an input signal is inputted to two semiconductor chips via a single electrode terminal, and in FIG. 4B, input signals are inputted to two semiconductor chips via two electrode terminals, respectively.

As illustrated in FIG. 4A, a semiconductor device 100a includes an electrode terminal 120 (on the left side in FIG. 4), in place of the first electrode terminal 130 and the second electrode terminal 140 of the semiconductor device 100. Other elements are the same as those of the semiconductor device 100.

In this case, an input signal inputted from the electrode terminal 120 (the external connection part 121) (on the left side in FIG. 4) is inputted to the anode electrodes of the first semiconductor chip 115 and the second semiconductor chip 116 via the conduction part 123, the wiring connection part 124, and the bonding wires 118. Next, an output signal from the cathode electrodes of the first semiconductor chip 115 and the second semiconductor chip 116 is outputted from the electrode terminal 120 (the external connection part 121) (on the right side in FIG. 4) to the outside via the metal plate 112b and the bonding wires 117.

With this semiconductor device 100a, since an input signal is inputted from a single part to the first semiconductor chip 115 and the second semiconductor chip 116 connected in parallel with each other, electrical characteristics of the first semiconductor chip 115 and electrical characteristics of the second semiconductor chip 116 cannot individually be measured.

In contrast, as illustrated in FIG. 4B, a semiconductor device 100b includes electrode terminals 150 and 160, in place of the first electrode terminal 130 and the second electrode terminal 140 of the semiconductor device 100. Other elements are the same as those of the semiconductor device 100.

In this case, since an input signal is inputted via each of the electrode terminals 150 and 160, electrical characteristics of the first semiconductor chip 115 and electrical characteristics of the second semiconductor chip 116 are individually measured.

However, with this semiconductor device 100b, while electrical characteristics of the first semiconductor chip 115 and electrical characteristics of the second semiconductor chip 116 can individually be measured, to connect the first semiconductor chip 115 and the second semiconductor chip 116 in parallel with each other and to cause the semiconductor device 100b to function as a single device, the electrode terminals 150 and 160 need to be connected. To connect the electrode terminals 150 and 160, wiring therefor needs to be made. If complex wiring is needed, it is difficult to achieve downsizing of the wiring around the semiconductor device 100b.

Thus, the above semiconductor device 100 includes the multi-layer substrate 112 that includes the insulating plate 112a and the metal plate 112b formed on the front side of the insulating plate 112a, the first semiconductor chip 115 and the second semiconductor chip 116 that are disposed on the metal plate 112b, the case 119 that holds the multi-layer substrate 112, the first semiconductor chip 115, and the second semiconductor chip 116, the first electrode terminal 130 that includes the first contact part 131a extending from a side of the case 119 and that is electrically connected to a main electrode of the first semiconductor chip 115 inside the case 119, and the second electrode terminal 140 that includes the second contact part 141a extending from the side and that is electrically connected to a main electrode of the second semiconductor chip 116 inside the case 119.

With this semiconductor device 100, the first contact part 131a and the second contact part 141a are disposed close to each other with the interval therebetween and form the screw hole 132 (connection area) to which an external connection terminal is connected. In addition, with this semiconductor device 100, the first contact part 131a extends from the side via the first linkage part 131b extending from the side, and the second contact part 141a extends from the side via the second linkage part 141b extending from the side. The first linkage part 131b and the second linkage part 141b are disposed away from each other by at least the certain interval.

In this way, without needing complex wiring, the semiconductor device 100 is allowed to have the first semiconductor chip 115 and the second semiconductor chip 116 connected in parallel with each other and function as a single device. In addition, with this semiconductor device 100, electrical characteristics of the first semiconductor chip 115 and electrical characteristics of the second semiconductor chip 116 are individually measured.

The semiconductor device 100 may have various modes by changing the shapes of the first external connection part 131 and the second external connection part 141.

First, a first variation as an example of one of the modes will be described with reference to FIG. 5.

Figure 5:
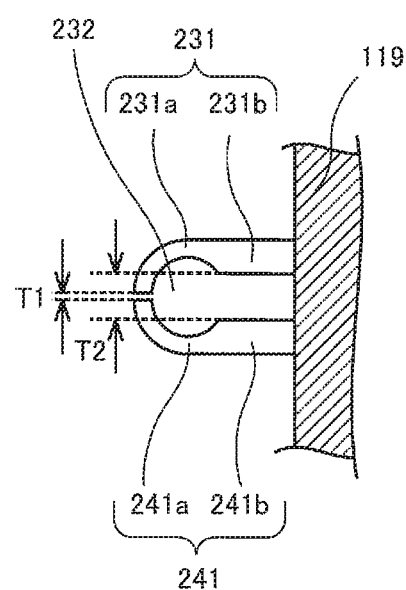
FIG. 5 illustrates electrode terminals of a semiconductor device according to a first variation of the first embodiment.

FIG. 5 illustrates electrode terminals of a semiconductor device according to a first variation of the first embodiment.

In FIG. 5, the semiconductor device 100 includes a first external connection part 231 and a second external connection part 241, in place of the first external connection part 131 of the first electrode terminal 130 and the second external connection part 141 of the second electrode terminal 140. FIG. 5 illustrates only the first external connection part 231, the second external connection part 241, and some elements therearound. Other elements are the same as those illustrated in FIGS. 1A and 1B.

The first external connection part 231 extends from a side of the case 119 and includes a first contact part 231a and a first linkage part 231b.

In addition, the second external connection part 241 extends from the side of the case 119 in parallel with the first external connection part 231 and includes a second contact part 241a and a second linkage part 241b.

These first contact part 231a and the second contact part 241a are disposed close to each other with an interval T1 therebetween and form a screw hole 232 (connection area) to which an external connection terminal is connected with a screw, as described above.

In addition, the first linkage part 231b and the second linkage part 241b are disposed away from each other by at least the certain interval T2.

Even when the first external connection part 231 and the second external connection part 241 are used, electrical characteristics of the first semiconductor chip 115 and electrical characteristics of the second semiconductor chip 116 can individually be measured by using the method described with reference to FIGS. 2A and 2B.

Thus, the use of the first external connection part 231 and the second external connection part 241 provides the same advantageous effects as those provided by the use of the first external connection part 131 and the second external connection part 141.

Next, a second variation will be described with reference to FIGS. 6A and 6B.

Figure 6A:
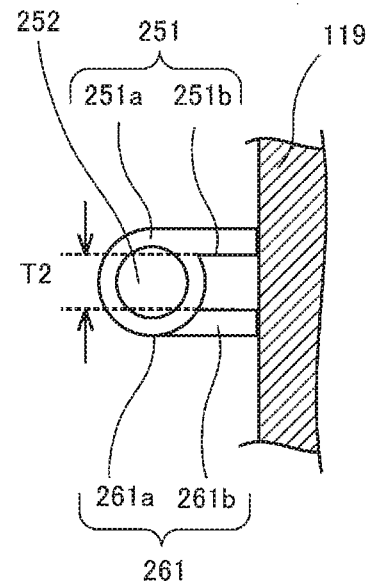
FIGS. 6A and 6B illustrate electrode terminals of a semiconductor device according to a second variation of the first embodiment.
Figure 6B:
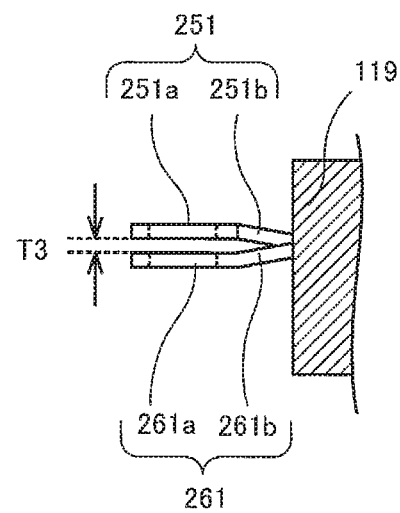

FIGS. 6A and 6B illustrate electrode terminals of a semiconductor device according to a second variation of the first embodiment.

In FIGS. 6A and 6B, the semiconductor device 100 includes a first external connection part 251 and a second external connection part 261, in place of the first external connection part 131 of the first electrode terminal 130 and the second external connection part 141 of the second electrode terminal 140 of the semiconductor device 100. FIGS. 6A and 6B illustrate only the first external connection part 251, the second external connection part 261, and some elements therearound. Other elements are the same as those illustrated in FIGS. 1A and 1B.

More specifically, FIG. 6A is a top view of the first external connection part 251 and the second external connection part 261, and FIG. 6B is a side view of the first external connection part 251 and the second external connection part 261.

The first external connection part 251 extends from a side of the case 119 and includes a first contact part 251a and a first linkage part 251b.

The first contact part 251a is formed in the shape of a ring and is connected to the first linkage part 251b.

In addition, the second external connection part 261 extends from the side of the case 119 in parallel with the first external connection part 251 and includes a second contact part 261a and a second linkage part 261b.

The second contact part 261a is formed in the shape of a ring and is connected to the second linkage part 261b.

The first contact part 251a of the first external connection part 251 and the second contact part 261a of the second external connection part 261 overlap with each other with an interval T3 therebetween. The positions of the rings of the first contact part 251a and the second contact part 261a are adjusted to form a screw hole 252. In addition, the first linkage part 251b of the first external connection part 251 and the second linkage part 261b of the second external connection part 261 are disposed away from each other by at least a certain interval T2.

In this way, an external connection terminal is fixed with a screw in the screw hole 252 formed by the first external connection part 251 and the second external connection part 261.

Thus, the use of the first external connection part 251 and the second external connection part 261 provides the same advantageous effects as those provided by the use of the first external connection part 131 and the second external connection part 141.

Next, measurement of electrical characteristics by using the first external connection part 251 and the second external connection part 261 will be described with reference to FIGS. 7A and 7B.

Figure 7A:
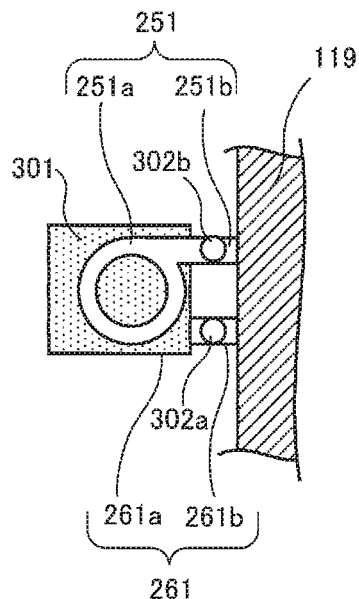
FIGS. 7A and 7B illustrate measurement of electrical characteristics of semiconductor chips of the semiconductor device according to the second variation of the first embodiment.
Figure 7B:
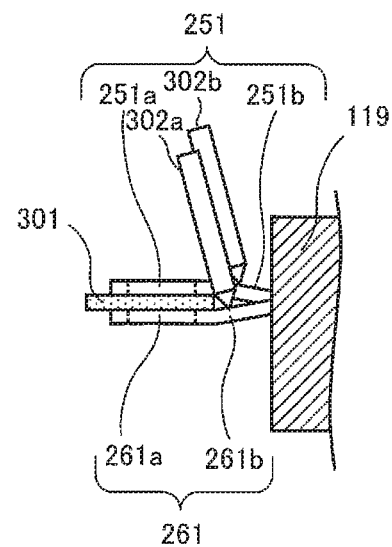

FIGS. 7A and 7B illustrate measurement of electrical characteristics of semiconductor chips of the semiconductor device according to the second variation of the first embodiment.

FIGS. 7A and 7B illustrate only the first external connection part 251, the second external connection part 261, and some elements therearound. Other elements are the same as those illustrated in FIGS. 1A and 1B.

More specifically, FIG. 7A is a top view of the first external connection part 251 and the second external connection part 261, and FIG. 7B is a side view of the first external connection part 251 and the second external connection part 261.

To measure electrical characteristics of the first semiconductor chip 115 and the second semiconductor chip 116 of the semiconductor device 100, first, the insulating separator 301 is inserted into the interval between the first contact part 251a of the first external connection part 251 and the second contact part 261a of the second external connection part 261. In this way, the first external connection part 251 and the second external connection part 261 are electrically insulated.

Next, the test electrodes 302b and 302a connected to the input device (not illustrated) that inputs an input signal are brought into contact with the first linkage part 251b of the first external connection part 251 and the second linkage part 261b of the second external connection part 261, respectively. The input device inputs an input signal to one or each of the test electrodes 302a and 302b.

By bringing the test electrodes 302a and 302b into contact with the first linkage part 251b and the second linkage part 261b, as described with reference to FIGS. 2A and 2B, electrical characteristics of the first semiconductor chip 115 and electrical characteristics of the second semiconductor chip 116 are individually measured.

Next, a third variation will be described with reference to FIGS. 8A to 8C.

Figure 8A:
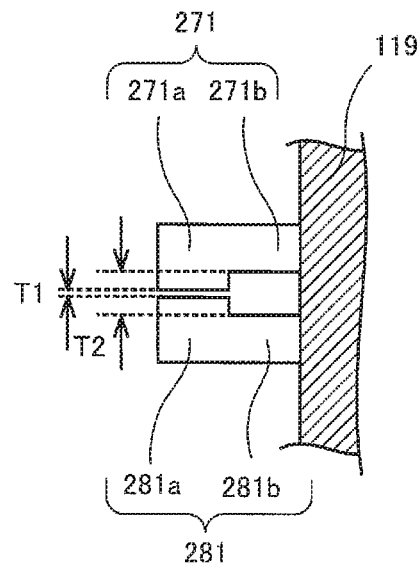
FIGS. 8A to 8C illustrate electrode terminals of a semiconductor device according to a third variation of the first embodiment and measurement of electrical characteristics of semiconductor chips of the semiconductor device.
Figure 8B:
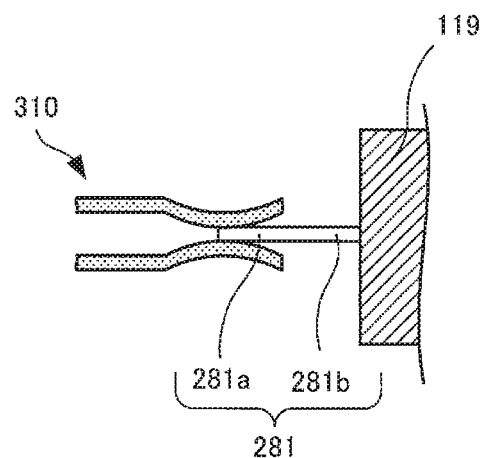
Figure 8C:
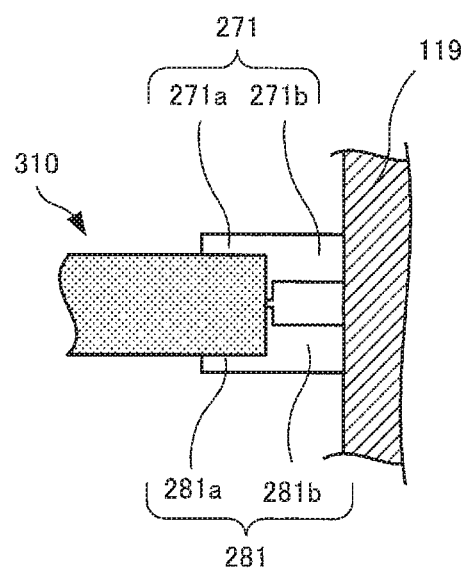

FIGS. 8A to 8C illustrate electrode terminals of a semiconductor device according to a third variation of the first embodiment and measurement of electrical characteristics of semiconductor chips of the semiconductor device.

In FIGS. 8A to 8C, the semiconductor device 100 includes a first external connection part 271 and a second external connection part 281, in place of the first external connection part 131 of the first electrode terminal 130 and the second external connection part 141 of the second electrode terminal 140. FIGS. 8A to 8C illustrate only the first external connection part 271, the second external connection part 281, and some elements therearound. Other elements are the same as those illustrated in FIGS. 1A and 1B.

More specifically, FIG. 8A is a top view of the first external connection part 271 and the second external connection part 281. FIG. 8B is a side view of the first external connection part 271 and the second external connection part 281 to which an external connection terminal is connected. FIG. 8C is a top view of the first external connection part 271 and the second external connection part 281 to which the external connection terminal is connected.

The first external connection part 271 extends from a side of the case 119 and includes a first contact part 271a and a first linkage part 271b.

The first contact part 271a is formed in the shape of a plate and is connected to the first linkage part 271b.

In addition, the second external connection part 281 extends from the side of the case 119 in parallel with the first external connection part 271 and includes a second contact part 281a and a second linkage part 281b.

The second contact part 281a is formed in the shape of a plate and is connected to the second linkage part 281b.

The first contact part 271a of the first external connection part 271 and the second contact part 281a of the second external connection part 281 are disposed close to each other and form a plate-like shape (connection area) with an interval T1 therebetween. In addition, the first linkage part 271b of the first external connection part 271 and the second linkage part 281b of the second external connection part 281 are disposed away from each other by at least a certain interval T2.

The first contact part 271a of the first external connection part 271 and the second contact part 281a of the second external connection part 281 are held by a clip-type external connection terminal 310, as illustrated in FIGS. 8B and 8C. In this way, the first contact part 271a and the second contact part 281a are electrically connected to the external connection terminal 310.

To measure electrical characteristics by using the first external connection part 271 and the second external connection part 281, as described with reference to FIGS. 2A and 2B, first, the insulating separator 301 is inserted into the interval T1 between the first contact part 271a of the first external connection part 271 and the second contact part 281a of the second external connection part 281.

Next, the test electrodes 302a and 302b connected to an input device (not illustrated) that inputs an input signal are brought into contact with the first linkage part 271b of the first external connection part 271 and the second linkage part 281b of the second external connection part 281, respectively.

In this way, electrical characteristics of the first semiconductor chip 115 and electrical characteristics of the second semiconductor chip 116 are individually measured.

Second Embodiment

A semiconductor device according to a second embodiment will be described with reference to FIGS. 9A to 9C.

Figure 9A:
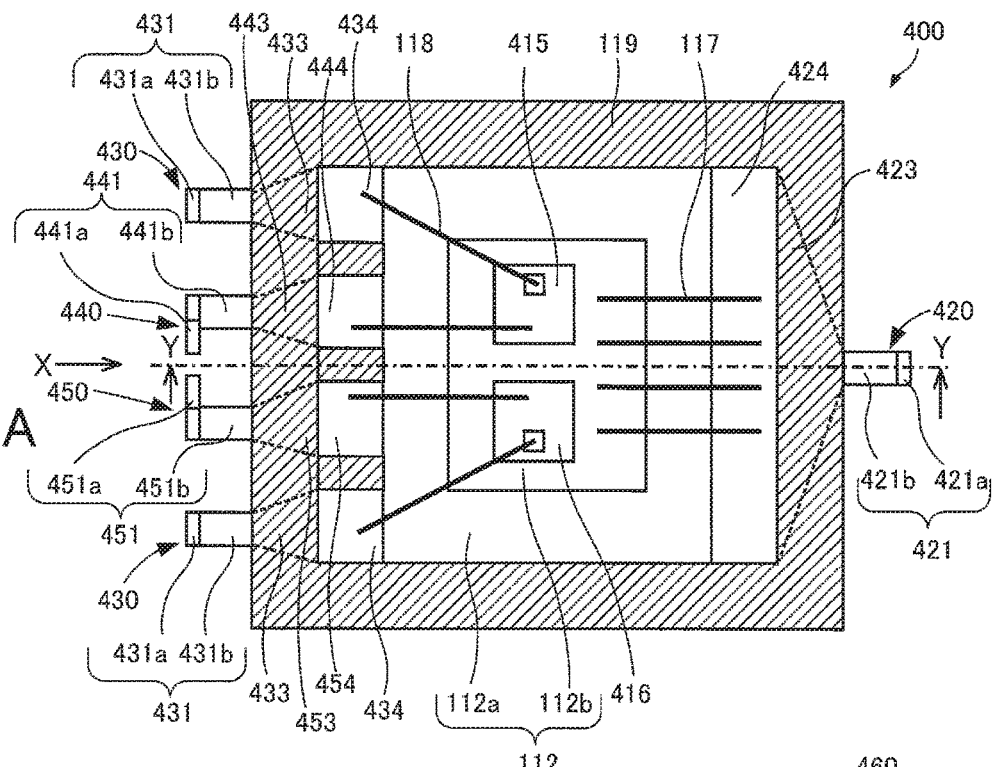
FIGS. 9A to 9C illustrate a semiconductor device according to a second embodiment.
Figure 9B:
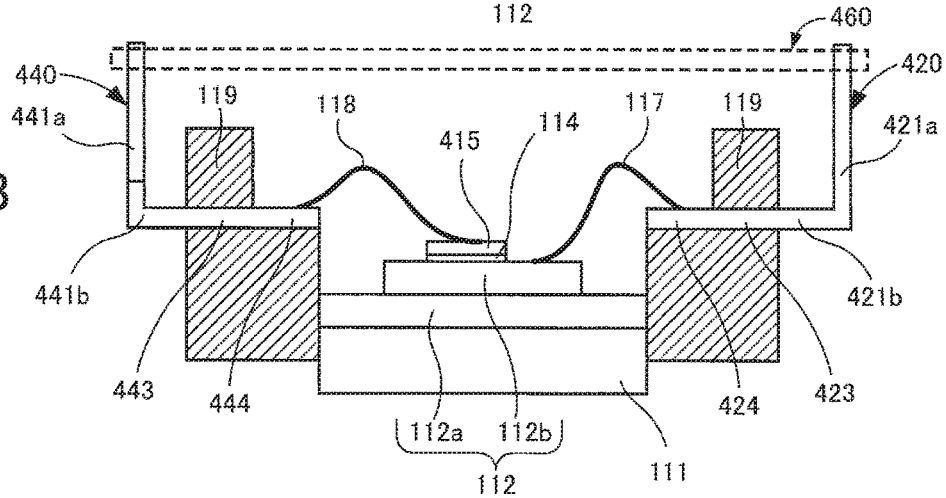
Figure 9C:
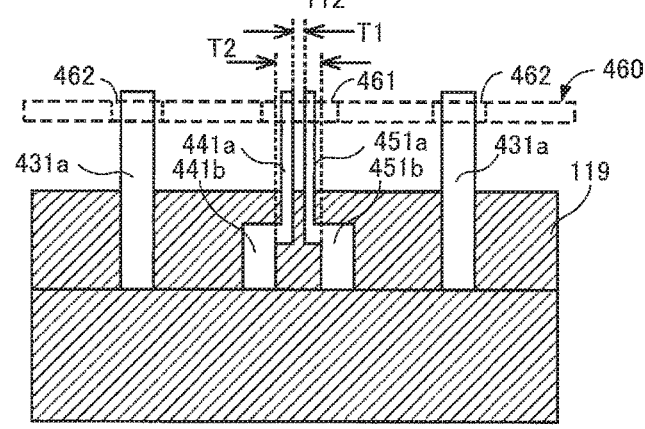

FIGS. 9A to 9C illustrate a semiconductor device 400 according to the second embodiment.

More specifically, FIG. 9A is a top view of the semiconductor device 400, and FIG. 9B is a sectional view taken along dashed line Y-Y in FIG. 9A. FIG. 9C is a side view seen from direction X indicated by an arrow in FIG. 9A.

In the semiconductor device 400, an aluminum insulating substrate 111, a multi-layer substrate 112 that is disposed on the aluminum insulating substrate 111 and that includes an insulating plate 112a and a metal plate 112b, and a first semiconductor chip 415 and a second semiconductor chip 416 that are disposed on the metal plate 112b via solder 114 are stacked. These elements are held and sealed with sealing resin (not illustrated) in a case 119.

For example, the first semiconductor chip 415 includes an IGBT, and the second semiconductor chip 416 includes a MOSFET. In this case, the first semiconductor chip 415 has a collector electrode on its back side and an emitter electrode and a gate electrode on its front side. The metal plate 112b is electrically connected to the back-side collector electrode. In addition, the second semiconductor chip 416 has a drain electrode on its back side and a source electrode and a gate electrode on its front side. The metal plate 112b is electrically connected to the back-side drain electrode.

In addition, the case 119 is provided with an electrode terminal 420 (on the right side in FIGS. 9A and 9B) and electrode terminals 430, a first electrode terminal 440, and a second electrode terminal 450 (on the left side in FIGS. 9A and 9B). Each of the electrode terminals 420 and 430, the first electrode terminal 440, and the second electrode terminal 450 is formed by a conductive member.

The electrode terminal 420 (on the right side in FIGS. 9A and 9B) includes an external connection part 421, a conduction part 423, and a wiring connection part 424.

The external connection part 421 extends from a side of the case 119 and includes a contact part 421a and a linkage part 421b.

The contact part 421a extends vertically with respect to the linkage part 421b that extends horizontally from the side of the case 119. As will be described below, the contact part 421a is fitted into a fitting hole (not illustrated) in a printed substrate 460 and is electrically connected to the printed substrate 460.

The linkage part 421b extends from the side of the case 119 and electrically connects the contact part 421a and the conduction part 423.

The conduction part 423 is electrically connected to the external connection part 421 and is incorporated in the case 119.

The wiring connection part 424 is electrically connected to the conduction part 423 and is disposed inside the case 119. In addition, the wiring connection part 424 is electrically connected to the metal plate 112b of the multi-layer substrate 112 via bonding wires 117.

In addition, each of the electrode terminals 430 (on the left side in FIGS. 9A and 9B) includes an external connection part 431, a conduction part 433, and a wiring connection part 434.

The external connection part 431 extends from a side of the case 119 and includes a contact part 431a and a linkage part 431b.

The contact part 431a extends vertically with respect to the linkage part 431b that extends horizontally from the side of the case 119. As will be described below, the contact part 431a is fitted into a fitting hole 462 in the printed substrate 460 and is electrically connected to the printed substrate 460.

The linkage part 431b extends from the side of the case 119 and electrically connects the contact part 431a and the conduction part 433.

The conduction part 433 is electrically connected to the external connection part 431 and is incorporated in the case 119.

The wiring connection part 434 is electrically connected to the conduction part 433 and is disposed inside the case 119. In addition, the wiring connection parts 434 are electrically connected to the gate electrodes of the first semiconductor chip 415 and the second semiconductor chip 416 on the metal plate 112b of the multi-layer substrate 112 via bonding wires 118.

In addition, the first electrode terminal 440 includes a first external connection part 441, a first conduction part 443, and a first wiring connection part 444.

The first external connection part 441 extends from the side of the case 119 and includes a first contact part 441a and a first linkage part 441b.

For example, the first contact part 441a is connected to an end of the first linkage part 441b and extends vertically.

The first linkage part 441b is formed in the shape of an L as illustrated in FIG. 9B and electrically connects the first contact part 441a and the first conduction part 443.

The first conduction part 443 is electrically connected to the first external connection part 441 and is incorporated in the case 119.

The first wiring connection part 444 is electrically connected to the first conduction part 443 and is disposed inside the case 119. In addition, the first wiring connection part 444 is electrically connected to the emitter electrode of the first semiconductor chip 415 on the metal plate 112b of the multi-layer substrate 112 via a bonding wire 118.

In addition, the second electrode terminal 450 includes a second external connection part 451, a second conduction part 453, and a second wiring connection part 454.

The second external connection part 451 extends from the side of the case 119 and includes a second contact part 451a and a second linkage part 451b.

For example, the second contact part 451a is connected to an end of the second linkage part 451b and extends vertically.

The second linkage part 451b is formed in the shape of an L as illustrated in FIG. 9B and is electrically connected to the second contact part 451a and the second conduction part 453.

The second conduction part 453 is electrically connected to the second external connection part 451 and is incorporated in the case 119.

The second wiring connection part 454 is electrically connected to the second conduction part 453 and is disposed inside the case 119. In addition, the second wiring connection part 454 is electrically connected to the source electrode of the second semiconductor chip 416 on the metal plate 112b of the multi-layer substrate 112 via a bonding wire 118.

The first contact part 441a of the first electrode terminal 440 and the second contact part 451a of the second electrode terminal 450 are disposed close to each other with an interval T1 therebetween. In addition, the first linkage part 441b and the second linkage part 451b are disposed away from each other by at least a certain interval T2.

With this semiconductor device 400, the printed substrate 460 is attached to the contact part 421a of the external connection part 421 of the electrode terminal 420 (on the right side in FIGS. 9A and 9B), the contact parts 431a of the external connection parts 431 of the electrode terminals 430 (on the left side in FIGS. 9A and 9B), the first contact part 441a of the first external connection part 441 of the first electrode terminal 440, and the second contact part 451a of the second external connection part 451 of the second electrode terminal 450.

More specifically, by fitting the contact part 421a of the external connection part 421 of the electrode terminal 420 into the fitting hole (not illustrated) in the printed substrate 460, the electrode terminal 420 is electrically connected to the printed substrate 460. In addition, by fitting the contact parts 431a of the external connection parts 431 of the electrode terminals 430 into the fitting holes 462 in the printed substrate 460, the electrode terminals 430 are electrically connected to the printed substrate 460. In addition, by fitting the first contact part 441a of the first external connection part 441 of the first electrode terminal 440 and the second contact part 451a of the second external connection part 451 of the second electrode terminal 450 into fitting holes 461 in the printed substrate 460, the first electrode terminal 440 and the second electrode terminal 450 are electrically connected to the printed substrate 460.

Thus, an input signal inputted from the external connection part 421 of the electrode terminal 420 is inputted to the collector electrode of the first semiconductor chip 415 and the drain electrode of the second semiconductor chip 416 via the conduction part 423, the wiring connection part 424, the bonding wires 117, and the metal plate 112b. Control signals inputted from the external connection parts 431 of the electrode terminals 430 are inputted to the gate electrodes of the first semiconductor chip 415 and the second semiconductor chip 416 via the conduction parts 433, the wiring connection parts 434, and the corresponding bonding wires 118. An output signal outputted from the emitter electrode of the first semiconductor chip 415 is outputted from the first external connection part 441 via the corresponding bonding wire 118, the first wiring connection part 444, and the first conduction part 443. An output signal outputted from the source electrode of the second semiconductor chip 416 is outputted from the second external connection part 451 via the corresponding bonding wire 118, the second wiring connection part 454, and the second conduction part 453. In this way, the output signals outputted from the first external connection part 441 and the second external connection part 451 are outputted to the printed substrate 460.

In addition, to measure electrical characteristics of the first semiconductor chip 415 and the second semiconductor chip 416 of the semiconductor device 400, as described with reference to FIGS. 2A and 2B, first, an insulating separator is inserted into the interval between the first contact part 441a and the second contact part 451a.

Next, test electrodes connected to a detection device (not illustrated) that detects an output signal are brought into contact with the first linkage part 441b of the first electrode terminal 440 (the first external connection part 441) and the second linkage part 451b of the second electrode terminal 450 (the second external connection part 451).

Next, an input device (not illustrated) that inputs an input signal is connected to the external connection part 421 of the electrode terminal 420 of the semiconductor device 400.

In this state, for example, when the input device inputs an input signal to the external connection part 421 (the contact part 421a) of the electrode terminal 420, the input signal travels along the conduction part 423, the wiring connection part 424, the bonding wires 117, and the metal plate 112b.

In this operation, if a control signal is inputted only to the gate electrode of the first semiconductor chip 415, since the input signal is inputted to the collector electrode of the first semiconductor chip 415, the output signal outputted from the emitter electrode of the first semiconductor chip 415 is outputted to the first external connection part 441 (the first contact part 441a) via the corresponding bonding wire 118, the first wiring connection part 444, and the first conduction part 443. In this way, electrical characteristics of the first semiconductor chip 415 are measured.

If a control signal is inputted only to the gate electrode of the second semiconductor chip 416, since the input signal is inputted to the drain electrode of the second semiconductor chip 416, the output signal outputted from the source electrode of the second semiconductor chip 416 is outputted from the second external connection part 451 (the second contact part 451a) via the corresponding bonding wire 118, the second wiring connection part 454, and the second conduction part 453. In this way, electrical characteristics of the second semiconductor chip 416 are measured.

As described above, the semiconductor device 400 includes the multi-layer substrate 112 that includes the insulating plate 112a and the metal plate 112b formed on the front side of the insulating plate 112a, the first semiconductor chip 415 and the second semiconductor chip 416 that are disposed on the metal plate 112b, the case 119 that holds the multi-layer substrate 112, the first semiconductor chip 415, and the second semiconductor chip 416, the first electrode terminal 440 that includes the first contact part 441a extending from a side of case 119 and that is electrically connected to a main electrode of the first semiconductor chip 415 inside the case 119, and the second electrode terminal 450 that includes the second contact part 451a extending from the side and that is electrically connected to a main electrode of the second semiconductor chip 416 inside the case 119.

The first contact part 441a and the second contact part 451a of the semiconductor device 400 are disposed close to each other with an interval therebetween, and an external connection terminal is connected to the first contact part 441a and the second contact part 451a. In addition, with this semiconductor device 400, the first contact part 441a extends from the side via the first linkage part 441b extending from the side, and the second contact part 451a extends from the side via the second linkage part 451b extending from the side. In addition, the first linkage part 441b and the second linkage part 451b are disposed away from each other by at least a certain interval.

In this way, without needing complex wiring for the peripheral circuits of the semiconductor device 400, the semiconductor device 400 is allowed to have the first semiconductor chip 415 and the second semiconductor chip 416 connected in parallel with each other and function as a power conversion device, a switching device, etc. In addition, with this semiconductor device 400, electrical characteristics of the first semiconductor chip 415 and electrical characteristics of the second semiconductor chip 416 can individually be measured.

In the second embodiment, the electrode terminal 120 according to the first embodiment (FIGS. 1A and 1B) may be used in place of the electrode terminal 420 or 430. The first external connection part 131 and the second external connection part 141 may be used in place of the first external connection part 441 and the second external connection part 451, respectively. In this case, other than the first external connection part 131 and the second external connection part 141, the first external connection part 251 and the second external connection part 261 (FIGS. 6A and 6B) or the first external connection part 271 and the second external connection part 281 (FIGS. 8A to 8C) may be used.

The bent part at the first contact part 441a and the first linkage part 441b and the bent part at the second contact part 451a and the second linkage part 451b are used for positioning of the insertion depth of lead frames when the printed substrate is mounted. These bent parts also prevent solder from climbing up.

Third Embodiment

Next, a semiconductor device according to a third embodiment will be described with reference to FIGS. 10A and 10B and FIGS. 11A and 11B.

Figure 10A:
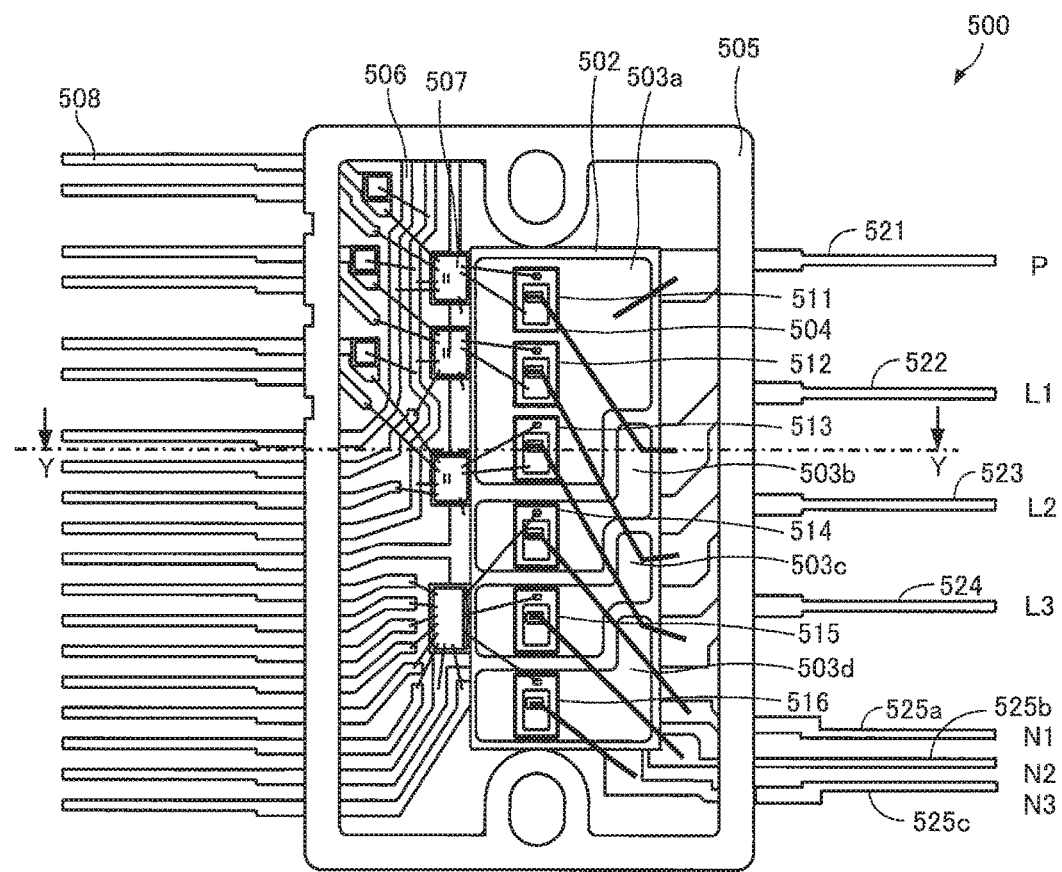
FIGS. 10A and 10B illustrate a semiconductor device according to a third embodiment.
Figure 10B:
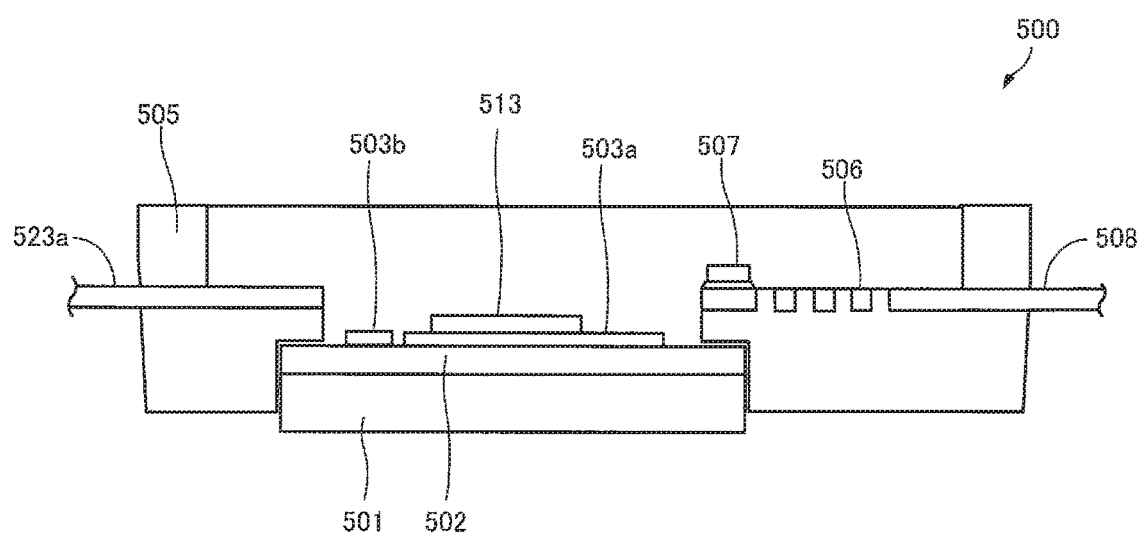

FIGS. 10A and 10B illustrate a semiconductor device 500 according to the third embodiment.

More specifically, FIG. 10A is a top view of the semiconductor device 500, and FIG. 10B is a sectional view taken along dashed line Y-Y in FIG. 10A. The bonding wires illustrated in FIG. 10A are not illustrated in FIG. 10B.

Figure 11A:
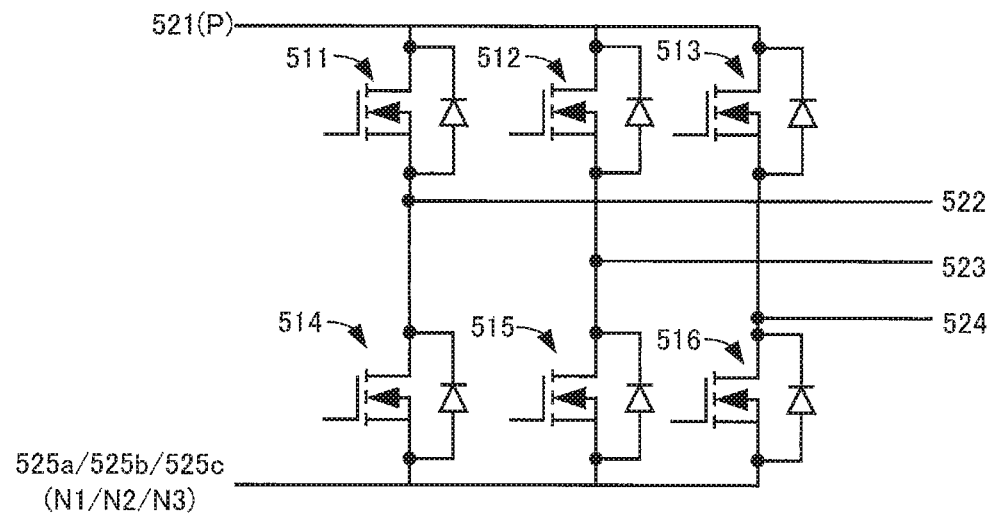
FIGS. 11A and 11B illustrate circuit configurations of the semiconductor device according to the third embodiment.
Figure 11B:
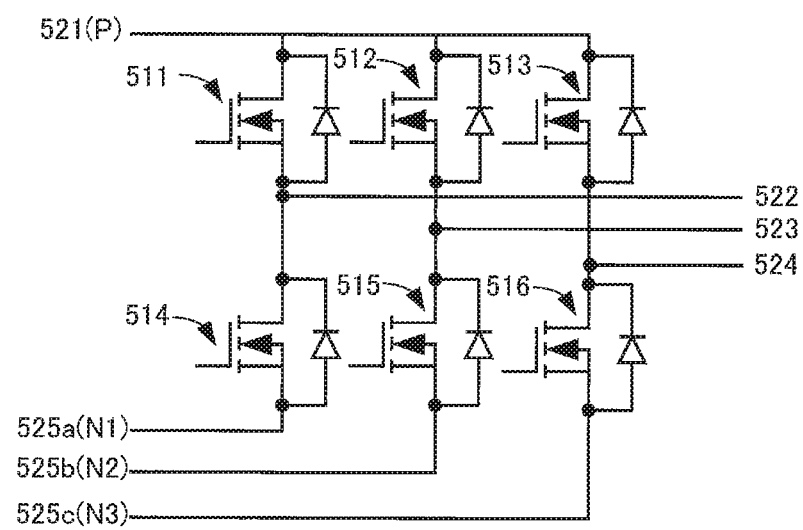

FIGS. 11A and 11B illustrate circuit configurations of the semiconductor device 500 according to the third embodiment.

FIG. 11A illustrates a circuit configuration when the semiconductor device 500 functions as a single device, and FIG. 11B illustrates a circuit configuration when electrical characteristics of semiconductor chips of the semiconductor device 500 are measured.

The semiconductor device 500 includes an aluminum insulating substrate 501, an insulating plate 502 disposed on the aluminum insulating substrate 501, and metal plates 503a to 503d disposed on the insulating plate 502. In addition, in the semiconductor device 500, semiconductor chips 511 to 513 are disposed on the front side of the metal plate 503a, a semiconductor chip 514 on the front side of the metal plate 503b, a semiconductor chip 515 on the front side of the metal plate 503c, and a semiconductor chip 516 on the front side of the metal plate 503d. These elements are held and sealed with sealing resin (not illustrated) in a case 505.

For example, the semiconductor chips 511 to 515 include MOSFETs and diodes.

In addition, in the case 505 (on the left side in FIG. 10A), electronic components 507, lead frames 508, and circuit wirings 506 that electrically connect the electronic components 507 and the lead frames 508 are arranged. The electronic components 507 are electrically connected to the gate electrodes of the semiconductor chips 511 to 515 via bonding wires so that control signals are inputted to the semiconductor chips 511 to 515. The electronic components 507 are boot strap diodes (BSDs) or integrated circuits (IC), for example.

In addition, ends of lead frames 521 to 524 and 525a to 525c are arranged inside the case 505 (on the right side in FIG. 10A). These lead frames extend to the outside of the case 505. As illustrated in FIG. 10A, the lead frames 521 to 524 and 525a to 525c are electrically connected to the metal plates 503a to 503d or the semiconductor chips 511 to 516 via bonding wires 504.

In particular, ends of the lead frames 525a and 525b are disposed close to each other with an interval therebetween, and the other ends thereof are disposed away from each other by at least a certain interval. Likewise, ends of the lead frames 525b and 525c are disposed close to each other with an interval therebetween, and the other ends thereof are disposed away from each other by at least a certain interval.

The lead frame 525a is electrically connected to the source electrode of the semiconductor chip 514. The lead frame 525b is electrically connected to the source electrode of the semiconductor chip 515. The lead frame 525c is electrically connected to the source electrode of the semiconductor chip 516.

The lead frame 521 is electrically connected to the drain electrodes of the semiconductor chips 511 to 513.

The lead frame 522 is electrically connected to the source electrode of the semiconductor chip 511 and the drain electrode of the semiconductor chip 514.

The lead frame 523 is electrically connected to the source electrode of the semiconductor chip 512 and the drain electrode of the semiconductor chip 515.

The lead frame 524 is electrically connected to the source electrode of the semiconductor chip 513 and the drain electrode of the semiconductor chip 516.

In the case of the semiconductor device 500 configured in the above way, as in the first and second embodiments, by connecting a positive (P) terminal to the lead frame 521 and connecting negative (N1 to N3) terminals to the lead frames 525a to 525c to obtain the same potential, the circuit configuration illustrated in FIG. 11A is obtained.

In contrast, by inserting insulating separators into the intervals where the ends of the lead frames 525a to 525c are disposed close to each other and bringing test electrodes connected to a detection device into contact with the other ends that are disposed away from each other by at least the certain interval, for example, the circuit configuration illustrated in FIG. 11B is obtained. In this way, electrical characteristics of the series-connected semiconductor chips 511 and 514, electrical characteristics of the series-connected semiconductor chips 512 and 515, and electrical characteristics of the series-connected semiconductor chips 513 and 516 can individually be measured.

The lead frames 508, 521 to 524, and 525a to 525c may be bent at desired positions and be electrically connected to a printed substrate as in the second embodiment.

Fourth Embodiment

Next, a semiconductor device according to a fourth embodiment will be described with reference to FIG. 12 and FIGS. 13A and 13B.

Figure 12:
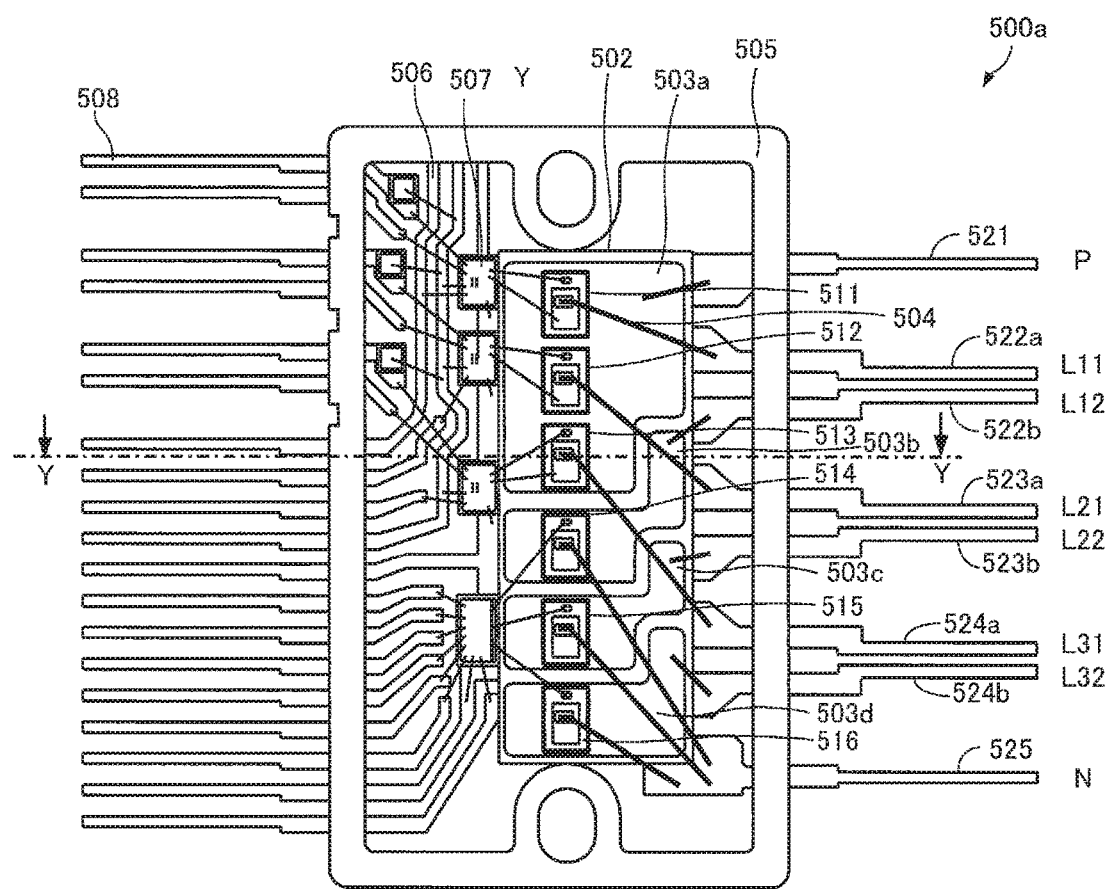
FIG. 12 illustrates a semiconductor device according to a fourth embodiment.

FIG. 12 illustrates a semiconductor device 500a according to the fourth embodiment.

Figure 13A:
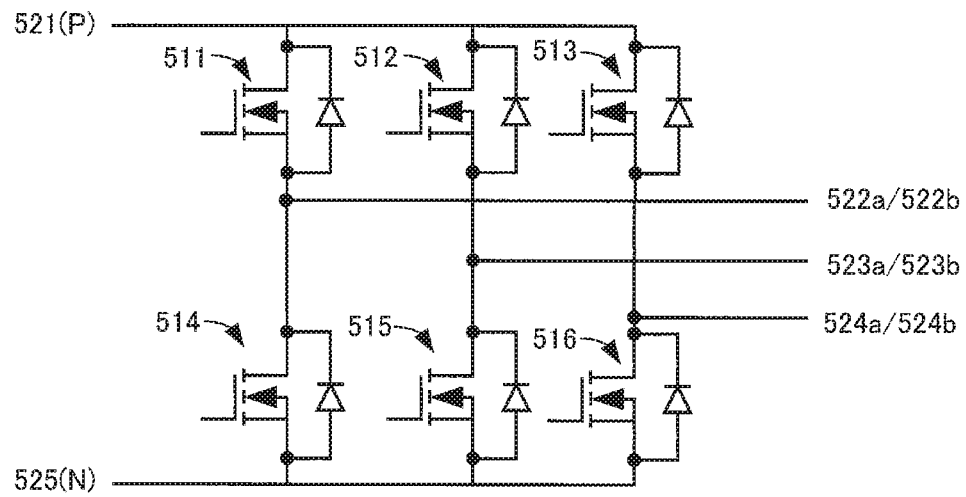
FIGS. 13A and 13B illustrate circuit configurations of the semiconductor device according to the fourth embodiment.
Figure 13B:
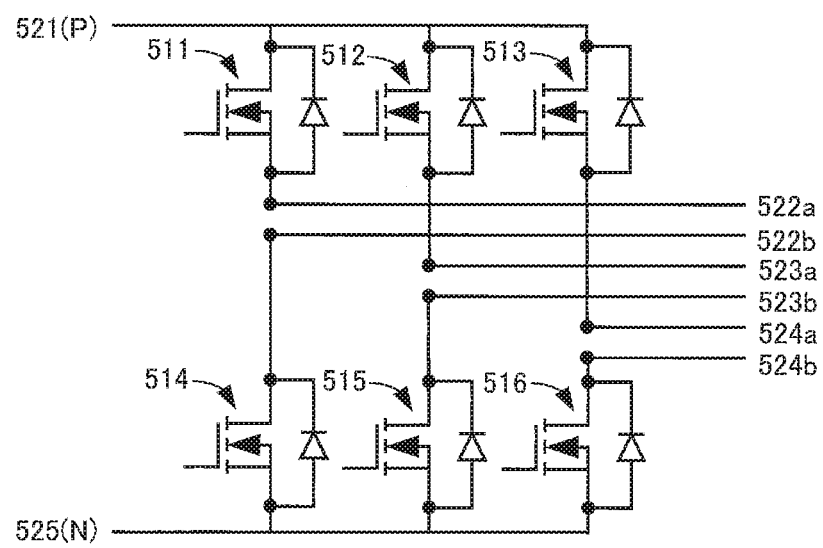

FIGS. 13A and 13B illustrate circuit configurations of the semiconductor device 500a according to the fourth embodiment.

FIG. 13A illustrates a circuit configuration when the semiconductor device 500a functions as a single device, and FIG. 13B illustrates a circuit configuration when electrical characteristics of semiconductor chips of the semiconductor device 500a are measured.

As in the semiconductor device 500 according to the third embodiment, the semiconductor device 500a includes an aluminum insulating substrate 501, an insulating plate 502 disposed on the aluminum insulating substrate 501, and metal plates 503a to 503d disposed on the insulating plate 502. In addition, in the semiconductor device 500a, semiconductor chips 511 to 513 are disposed on the front side of the metal plate 503a, a semiconductor chip 514 on the front side of the metal plate 503b, a semiconductor chip 515 on the front side of the metal plate 503c, and a semiconductor chip 516 on the front side of the metal plate 503d. These elements are held and sealed with sealing resin (not illustrated) in a case 505.

For example, the semiconductor chips 511 to 515 include MOSFETs and diodes.

In addition, in the case 505 (on the left side n FIG. 12), electronic components 507, lead frames 508, and circuit wirings 506 that electrically connect the electronic components 507 and the lead frames 508 are arranged. The electronic components 507 are electrically connected to the gate electrodes of the semiconductor chips 511 to 515 via bonding wires so that control signals are inputted to the semiconductor chips 511 to 515. The electronic components 507 are boot strap diodes (BSDs) or integrated circuits (IC), for example.

However, in the semiconductor device 500a according to the fourth embodiment, ends of lead frames 521, 522a, 522b, 523a, 523b, 524a, 524b, and 525 are arranged inside the case 505 (on the right side in FIG. 12). These lead frames extend to the outside of the case 505. As illustrated in FIG. 12, the lead frames 521, 522a, 522b, 523a, 523b, 524a, 524b, and 525 are electrically connected to the metal plates 503a to 503d or the semiconductor chips 511 to 516 via bonding wires 504.

In particular, ends of the lead frames 522a and 522b are disposed close to each other with an interval therebetween, and the other ends thereof are disposed away from each other by at least a certain interval. In addition, the lead frame 522a is electrically connected to the source electrode of the semiconductor chip 511, and the lead frame 522b is electrically connected to the drain electrode of the semiconductor chip 514.

In addition, ends of the lead frames 523a and 523b are disposed close to each other with an interval therebetween, and the other ends thereof are disposed away from each other by at least a certain interval. The lead frame 523a is electrically connected to the source electrode of the semiconductor chip 512, and the lead frame 523b is electrically connected to the drain electrode of the semiconductor chip 515.

In addition, ends of the lead frames 524a and 524b are disposed close to each other with an interval therebetween, and the other ends thereof are disposed away from each other by at least a certain interval. The lead frame 524a is electrically connected to the source electrode of the semiconductor chip 513, and the lead frame 524b is electrically connected to the drain electrode of the semiconductor chip 516.

The lead frame 521 is electrically connected to the drain electrodes of the semiconductor chips 511 to 513. In addition, the lead frame 525 is electrically connected to the source electrodes of the semiconductor chips 514 to 516.

In this way, the semiconductor device 500a forms the circuit configuration illustrated in FIG. 13B.

When this semiconductor device 500a is used as a single device, the lead frames 522a and 522b, the lead frames 523a and 523b, and the lead frames 524a and 524b are combined together to have the same potential. In this way, the circuit configuration illustrated in FIG. 13A is obtained.

In contrast, for example, in FIG. 13B, a positive (P) terminal is connected to the lead frame 521 and a negative (N) terminal (detection device) is connected to the lead frame 525. In addition, an insulating separator is inserted into the interval where the ends of the lead frames 522a and 522b are disposed close to each other. In addition, a test electrode connected to a detection device is brought into contact with the end of the lead frame 522a that is disposed away from the corresponding end of the lead frame 522b by at least a certain interval. In addition, a test electrode connected to an input device is brought into contact with the end of the lead frames 522b that is disposed away from the end of the lead frame 522a by at least a certain interval. In this way, as in the first embodiment, electrical characteristics of the semiconductor chips 511 and 514 are measured. In addition, by bringing test electrodes into contact with the lead frames 523a, 523b, 524a, and 524b in a like way, electrical characteristics of the semiconductor chips 512, 513, 515, and 516 are measured.

As in the third embodiment, the lead frames 580, 521, 522a, 522b, 523a, 523b, 524a, 524b, and 525 may be bent at desired positions and be electrically connected to a printed substrate.

In the above embodiments, the lead frames are disposed in the case. However, the lead frames may directly be sealed with sealing resin, without using the case.

According to the present technique, wiring of a semiconductor device is easily made so that the semiconductor device functions as a single device, and characteristics of an individual semiconductor chip of the semiconductor device can be measured.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A method of measuring a semiconductor device, comprising:
   preparing the semiconductor device to include
      a multi-layer substrate that includes an insulating plate and a metal plate formed on a front side of the insulating plate,
      a first semiconductor chip and a second semiconductor chip each having a back side that is disposed on the metal plate,
      a case that holds the multi-layer substrate, the first semiconductor chip, and the second semiconductor chip,
      a first electrode terminal that includes a first contact part extending from a side of the case via a first linkage part extending from the side and that is electrically connected to a main electrode of a front side of the first semiconductor chip inside the case, and
      a second electrode terminal that includes a second contact part extending from the side via a second linkage part extending from the side and that is electrically connected to a main electrode of a front side of the second semiconductor chip inside the case,
the first contact part and the second contact part being disposed
with an interval therebetween so that the first semiconductor chip receives first signal through the first contact part and that the second semiconductor chip receives a second signal through the second contact part, and
close to each other to form a connection area through which an external connection terminal is connectable, so that both of the first semiconductor chip and the second semiconductor chip receive a common signal through the connection area when the external connection terminal is connected to the connection area and
the first linkage part and the second linkage part being disposed away from each other by at least a certain interval;
bringing test electrodes into contact with the first linkage part and the second linkage part, respectively;
inserting an insulating member into the interval between the first contact part and the second contact part; and
measuring electrical characteristics of the first semiconductor chip and the second semiconductor chip.

2. The method of measuring a semiconductor device of claim 1, wherein the backside of each of the first and second semiconductor chips is electrically connected to the metal plate.

3. A semiconductor device, comprising:
a metal plate;
a first semiconductor chip having a back side mounted on the metal plate;
a second semiconductor chip having a back side mounted on the metal plate;
a first electrode terminal electrically connected to a first electrode of a front side of the first semiconductor chip; and
a second electrode terminal electrically connected to a first electrode of a front side of the second semiconductor chip,
wherein the first and second electrode terminals
are arranged adjacent to each other and physically separated from each other so that the first semiconductor chip receives a first signal through the first contact part and the second semiconductor chip receives a second signal through the second contact part, and
are positioned to define an opening having a geometric shape so that both of the first semiconductor chip and the second semiconductor chip receive a common signal by inserting an external connection terminal through the opening.

4. The semiconductor device of claim 3, wherein the first electrode terminal includes a first groove defining a half of the geometric shape,
the second electrode terminal includes a second groove defining a half of the geometric shape, and
the first electrode terminal and the second electrode terminal area arranged such that the first groove faces the second groove to together define the geometric shape.

5. The semiconductor device of claim 4, wherein the geometric shape is a circle, and
the first and second electrode terminals have symmetrical arc-shapes surrounding semi-circular shaped first and second grooves, respectively.

6. The semiconductor device of claim 3, wherein the geometric shape is a circle, and
the first and second electrode terminals have loop shapes defining circle-shaped openings, the first electrode terminal being positioned above the second electrode terminal and physically separated from the second electrode terminal, such that the circle-shaped opening of the first electrode terminal is aligned with the circle-shaped opening of the second electrode terminal.

7. The semiconductor device of claim 3, further comprising a case encasing the metal plate and the first and second semiconductor chips,
wherein each of the first and second electrode terminals includes a first portion located inside the case, a second portion extending through a wall of the case, and a third portion outside the case,
wherein the first portions of the first and second electrode terminals located inside the case are separated by a first distance, and the third portions of the first and second electrode terminals located outside the case are separated by a second distance less than the first distance.

8. The semiconductor device of claim 3, further comprising a third electrode terminal electrically connected to a second electrode of each of the first and second semiconductor chips.

9. The semiconductor device of claim 3, wherein the backside of each of the first and second semiconductor chips is electrically connected to the metal plate.

10. A semiconductor device, comprising:
a first semiconductor chip and a second semiconductor chip each having a back side that is disposed on a metal plate;
a first electrode terminal that is electrically connected to a main electrode of a front side of the first semiconductor chip; and
a second electrode terminal that is electrically connected to a main electrode of a front side of the second semiconductor chip,
wherein the first electrode terminal includes a first contact part, and the second electrode terminal includes a second contact part, and
wherein the first contact part and the second contact part are
disposed with an interval therebetween so that the first semiconductor chip receives a first signal through the first contact part and the second semiconductor chip receives a second signal through the second contact part, and
disposed close to each other to form a connection area through which an external connection terminal is connectable, so that both of the first semiconductor chip and the second semiconductor chip receive a common signal through the connection area when the external connection terminal is connected to the connection area.

11. The semiconductor device according to claim 10, further comprising:
a multi-layer substrate including the metal plate and an insulating plate having a front side on which the metal plate is formed, wherein the multi-layer substrate, the first semiconductor chip, and the second semiconductor chip are held inside a case, wherein the first contact part and the second contact part extend from a side of the case, wherein the first electrode terminal is electrically connected to the main electrode of the first semiconductor chip inside the case, and wherein the second electrode terminal is electrically connected to the main electrode of the second semiconductor chip inside the case.

12. The semiconductor device according to claim 11, wherein the first contact part extends from the side of the case via a first linkage part that extends from the side of the case, wherein the second contact part extends from the side of the case via a second linkage part that extends from the side of the case, and wherein the first linkage part and the second linkage part are disposed apart from each other by at least a certain interval.

13. The semiconductor device according to claim 12, wherein a first opening is formed in the first contact part, and a second opening is formed in the second contact part, and wherein the first opening in the first contact part and the second opening in the second contact part overlap with each other to form a screw hole as the connection area.

14. The semiconductor device according to claim 10, wherein the first contact part and the second contact part are shaped to form a screw hole as the connection area.

15. The semiconductor device according to claim 10, wherein the first semiconductor chip and the second semiconductor chip are electrically connected in parallel with each other.

16. The semiconductor device of claim 15, wherein the first semiconductor chip and the second semiconductor chip are MOSFETs, IGBTs or diodes.

17. The semiconductor device of claim 10, wherein the backside of each of the first and second semiconductor chips is electrically connected to the metal plate.

* * * * *